(12) United States Patent
Sen et al.

(10) Patent No.: US 7,375,369 B2
(45) Date of Patent: May 20, 2008

(54) SPIN-COATABLE LIQUID FOR FORMATION OF HIGH PURITY NANOTUBE FILMS

(75) Inventors: Rahul Sen, Wilmington, MA (US); Ramesh Sivarajan, Medford, MA (US); Thomas Rueckes, Boston, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 671 days.

(21) Appl. No.: 10/860,334

(22) Filed: Jun. 3, 2004

(65) Prior Publication Data

US 2005/0058590 A1    Mar. 17, 2005

Related U.S. Application Data

(60) Provisional application No. 60/501,033, filed on Sep. 8, 2003.

(51) Int. Cl.
*H01L 29/08* (2006.01)
*H01L 35/24* (2006.01)
*H01L 51/00* (2006.01)
*H01L 21/00* (2006.01)
*H01L 21/31* (2006.01)

(52) U.S. Cl. .......................... 257/40; 438/82; 438/99; 438/780; 438/781

(58) Field of Classification Search ................. 257/40; 438/82, 99, 780–781
See application file for complete search history.

(56) References Cited

U.S. PATENT DOCUMENTS

| | | | |
|---|---|---|---|
| 5,591,312 A * | 1/1997 | Smalley .................. | 204/157.41 |
| 5,698,175 A | 12/1997 | Hiura et al. | |
| 6,084,053 A | 7/2000 | Matsubara et al. | |
| 6,187,823 B1 | 2/2001 | Haddon et al. .................. | 516/32 |
| 6,277,318 B1 | 8/2001 | Bower et al. | |
| 6,331,262 B1 | 12/2001 | Haddon et al. .................. | 252/502 |
| 6,368,569 B1 | 4/2002 | Haddon et al. .................. | 423/460 |
| 6,465,813 B2 | 10/2002 | Ihm et al. | |

(Continued)

FOREIGN PATENT DOCUMENTS

EP       1061040       12/2000

(Continued)

OTHER PUBLICATIONS

United States Patent and Trademark Office, International Search Report for PCT/US05/17839, mailed Aug. 10, 2006, 1 page.

(Continued)

*Primary Examiner*—Ida M. Soward
(74) *Attorney, Agent, or Firm*—Wilmer Cutler Pickering Hale and Dorr LLP

(57) ABSTRACT

Certain spin-coatable liquids and application techniques are described, which can be used to form nanotube films or fabrics of controlled properties. A spin-coatable liquid for formation of a nanotube film includes a liquid medium containing a controlled concentration of purified nanotubes, wherein the controlled concentration is sufficient to form a nanotube fabric or film of preselected density and uniformity, and wherein the spin-coatable liquid includes less than $1 \times 10^{18}$ atoms/cm$^3$ of metal impurities. The spin-coatable liquid is substantially free of particle impurities having a diameter of greater than about 500 nm.

7 Claims, 2 Drawing Sheets

U.S. PATENT DOCUMENTS

| | | | |
|---|---|---|---|
| 6,515,325 B1 | 2/2003 | Farnworth et al. | |
| 6,531,513 B2 | 3/2003 | Haddon et al. | 516/32 |
| 6,569,595 B1 | 5/2003 | Sato et al. | |
| 6,574,130 B2 | 6/2003 | Segal et al. | 365/129 |
| 6,627,689 B2 | 9/2003 | Iino | |
| 6,630,772 B1 | 10/2003 | Bower et al. | |
| 6,641,793 B2 | 11/2003 | Haddon et al. | 423/447.2 |
| 6,643,165 B2 | 11/2003 | Segal et al. | |
| 6,683,783 B1 | 1/2004 | Smalley et al. | |
| 6,706,402 B2 | 3/2004 | Rueckes et al. | 428/402 |
| 6,723,299 B1 | 4/2004 | Chen et al. | |
| 6,752,977 B2 | 6/2004 | Smalley et al. | |
| 6,808,746 B1 | 10/2004 | Dai et al. | |
| 6,896,864 B2 | 5/2005 | Clarke | |
| 6,899,945 B2 | 5/2005 | Smalley et al. | |
| 6,921,575 B2 | 7/2005 | Horiuchi et al. | |
| 6,936,322 B2 | 8/2005 | Sakakibara et al. | |
| 6,946,410 B2 | 9/2005 | French et al. | |
| 7,048,999 B2 | 5/2006 | Smalley et al. | |
| 7,061,749 B2 | 6/2006 | Liu et al. | |
| 7,115,864 B2 | 10/2006 | Colbert et al. | |
| 7,166,266 B2 | 1/2007 | Nikolaev et al. | |
| 2002/0081380 A1 | 6/2002 | Dillon et al. | |
| 2003/0021141 A1 | 1/2003 | Segal et al. | |
| 2003/0021966 A1 | 1/2003 | Segal et al. | |
| 2003/0022428 A1 | 1/2003 | Segal et al. | |
| 2003/0065206 A1 | 4/2003 | Bolskar et al. | |
| 2003/0122111 A1 | 7/2003 | Glatkowski | |
| 2003/0124325 A1 | 7/2003 | Rueckes et al. | |
| 2003/0124837 A1 | 7/2003 | Rueckes et al. | |
| 2003/0129471 A1 | 7/2003 | Kitade et al. | |
| 2003/0148161 A1* | 8/2003 | Nuber et al. | 429/33 |
| 2003/0165074 A1 | 9/2003 | Segal et al. | |
| 2003/0177450 A1 | 9/2003 | Nugent | |
| 2003/0180472 A1 | 9/2003 | Zhou et al. | |
| 2003/0198812 A1 | 10/2003 | Rueckes et al. | |
| 2003/0199172 A1 | 10/2003 | Rueckes et al. | |
| 2003/0220518 A1 | 11/2003 | Bolskar et al. | 560/19 |
| 2003/0234407 A1 | 12/2003 | Vogeli et al. | |
| 2003/0236000 A1 | 12/2003 | Vogeli et al. | |
| 2004/0016922 A1* | 1/2004 | Allenspach et al. | 257/46 |
| 2004/0023514 A1 | 2/2004 | Moriya et al. | |
| 2004/0034177 A1 | 2/2004 | Chen | 525/416 |
| 2004/0041154 A1 | 3/2004 | Watanabe et al | |
| 2004/0071949 A1 | 4/2004 | Glatkowski et al. | |
| 2004/0075159 A1 | 4/2004 | Vogeli | |
| 2004/0077107 A1 | 4/2004 | Vogeli | |
| 2004/0085805 A1 | 5/2004 | Segal et al. | |
| 2004/0087162 A1 | 5/2004 | Vogeli | |
| 2004/0099438 A1 | 5/2004 | Arthur et al. | |
| 2004/0159833 A1 | 8/2004 | Rueckes et al. | |
| 2004/0164289 A1 | 8/2004 | Rueckes et al. | |
| 2004/0175856 A1 | 9/2004 | Jaiprakash et al. | |
| 2004/0181630 A1 | 9/2004 | Jaiprakash et al. | |
| 2004/0191978 A1 | 9/2004 | Rueckes et al. | |
| 2004/0214041 A1* | 10/2004 | Lu et al. | 428/690 |
| 2004/0214366 A1 | 10/2004 | Segal et al. | |
| 2004/0214367 A1 | 10/2004 | Segal et al. | |
| 2004/0247896 A1* | 12/2004 | Apen et al. | 428/447 |
| 2004/0265550 A1 | 12/2004 | Glatkowski et al. | |
| 2005/0028515 A1 | 2/2005 | Fukuma et al. | |
| 2005/0035344 A1 | 2/2005 | Bertin et al. | |
| 2005/0035367 A1 | 2/2005 | Bertin et al. | |
| 2005/0035786 A1 | 2/2005 | Bertin et al. | |
| 2005/0035787 A1 | 2/2005 | Bertin et al. | |
| 2005/0036365 A1 | 2/2005 | Bertin et al. | |
| 2005/0037547 A1 | 2/2005 | Bertin et al. | |
| 2005/0041465 A1 | 2/2005 | Rueckes et al. | |
| 2005/0041466 A1 | 2/2005 | Rueckes et al. | |
| 2005/0047244 A1 | 3/2005 | Rueckes et al. | |
| 2005/0052894 A1 | 3/2005 | Segal et al. | |
| 2005/0053525 A1 | 3/2005 | Segal et al. | |
| 2005/0056825 A1 | 3/2005 | Bertin et al. | |
| 2005/0056866 A1 | 3/2005 | Bertin et al. | |
| 2005/0056877 A1 | 3/2005 | Rueckes et al. | |
| 2005/0058590 A1 | 3/2005 | Sen et al. | |
| 2005/0058797 A1 | 3/2005 | Sen et al. | |
| 2005/0058834 A1 | 3/2005 | Rueckes et al. | |
| 2005/0059176 A1 | 3/2005 | Rueckes et al. | |
| 2005/0059210 A1 | 3/2005 | Rueckes et al. | |
| 2005/0062035 A1 | 3/2005 | Bertin et al. | |
| 2005/0062062 A1 | 3/2005 | Bertin et al. | |
| 2005/0062070 A1 | 3/2005 | Bertin et al. | |
| 2005/0063210 A1 | 3/2005 | Segal et al. | |
| 2005/0063244 A1 | 3/2005 | Bertin et al. | |
| 2005/0065741 A1 | 3/2005 | Segal et al. | |
| 2005/0074926 A1 | 4/2005 | Bertin et al. | |
| 2005/0100501 A1* | 5/2005 | Veedu et al. | 423/447.2 |
| 2005/0101112 A1 | 5/2005 | Rueckes et al. | |
| 2005/0128788 A1 | 6/2005 | Segal et al. | |
| 2005/0174842 A1 | 8/2005 | Bertin et al. | |
| 2005/0191495 A1 | 9/2005 | Rueckes et al. | |
| 2005/0237781 A1 | 10/2005 | Bertin et al. | |
| 2005/0269553 A1 | 12/2005 | Sen et al. | |
| 2005/0269554 A1 | 12/2005 | Sen et al. | |
| 2005/0270824 A1 | 12/2005 | Bertin et al. | |
| 2005/0279988 A1 | 12/2005 | Bertin | |
| 2005/0280436 A1 | 12/2005 | Bertin | |
| 2005/0281084 A1 | 12/2005 | Rueckes et al. | |
| 2005/0282515 A1 | 12/2005 | Bertin | |
| 2005/0282516 A1 | 12/2005 | Bertin | |
| 2006/0044035 A1 | 3/2006 | Bertin | |
| 2006/0052509 A1 | 3/2006 | Saitoh | |
| 2006/0061389 A1 | 3/2006 | Bertin | |
| 2006/0115640 A1* | 6/2006 | Yodh et al. | 428/221 |
| 2006/0125033 A1 | 6/2006 | Segal et al. | |
| 2006/0128049 A1 | 6/2006 | Jaiprakash et al. | |
| 2006/0183278 A1 | 8/2006 | Bertin et al. | |
| 2006/0193093 A1 | 8/2006 | Bertin et al. | |
| 2006/0204427 A1 | 9/2006 | Ghenciu et al. | |
| 2006/0231865 A1 | 10/2006 | Rueckes et al. | |
| 2006/0237805 A1 | 10/2006 | Segal et al. | |
| 2006/0237857 A1 | 10/2006 | Bertin et al. | |
| 2006/0250843 A1 | 11/2006 | Bertin et al. | |
| 2006/0250856 A1 | 11/2006 | Bertin et al. | |
| 2006/0255834 A1 | 11/2006 | Bertin | |
| 2006/0276056 A1 | 12/2006 | Ward et al. | |

FOREIGN PATENT DOCUMENTS

| | | |
|---|---|---|
| WO | WO-98/39250 A1 | 9/1998 |
| WO | WO-00/17101 | 3/2000 |
| WO | WO-02/060812 A3 | 8/2002 |
| WO | WO-03/034142 | 4/2003 |
| WO | WO-03/091486 | 11/2003 |
| WO | WO-2004/039893 | 5/2004 |
| WO | WO-2004/065655 | 8/2004 |
| WO | WO-2004/065657 | 8/2004 |
| WO | WO-2004/065671 | 8/2004 |
| WO | WO-2006/078293 | 7/2006 |

OTHER PUBLICATIONS

United States Patent and Trademark Office, International Search Report for PCT/US05/18465, mailed Aug. 21, 2006, 1 page.

United States Patent and Trademark Office, International Search Report for PCT/US05/18539, mailed Sep. 18, 2006, 1 page.

United States Patent and Trademark Office, International Search Report PCT/US05/18600, mailed Aug. 3, 2006, 1 page.

Chen et al., "Noncovalent Sidewall Functionalization of Single-Walled Carbon Nanotubes for Protein Immobilization", *J. Am. Chem. Soc.*, vol. 123, pp. 3838-3839, 2001.

Chiang, et al., Purification and Characterization of Single-Wall Carbon Nanotubes (SWNTs) Obtained from the Gas-Phase Decomposition of CO (HiPco Process), J. Phys. Chem. B, vol. 105, pp. 8297-8301, 2001.

Onoa et al., "Bulk production of singly dispersed carbon nanotubes with prescribed lengths", Nanotechnology, vol. 16, pp. 2799-2803, 2005.

Parikh, et al., "Flexible vapour sensors using single walled carbon nanotubes", Elsevier, Sensors and Actuators, B 113, pp. 55-63, 2006.

Rinzler, "Large-scale purification of single-wall carbon nanotubes: process, product, and characterization", Appl. Phys. A, vol. 67, pp. 29-37, 1998.

Bahr, J.L., et al., "Dissolution of small diameter single-wall carbon nanotubes in organic solvents", Chem. Commun., 2001, 193-194.

O'Connell, M.J., et al., "Reversible water-soluablization of single-walled carbon nanotubes by polymer wrapping", Chem. Phys. Lett. 342 (2001) 265-271.

Jian Chen, J., et al., "Dissolution of Full-Length Single-Walled Carbon Nanotubes", J. Phys. Chem. B 2001, 105, 2525-2528.

Ausman, K.D., et a.' "Organic Solvent Dispersions of Single-Walled Carbon Nanotubes: Toward Solution of Pristine Nanotubes", J. Phys. Chem., B. vol. 104 No. 38, 8911-8915 (2000).

Mickelson, E. T., et al., "Solvation of Fluorinated Single-Wall Carbon Nanotubes in Alcohol Solvents", J. Phys. Chem. B 1999, 103, 4318-4322.

Star, A., et al., "Preparation and Properties of Polymer-Wrapped Single-Walled Carbon Nanotubes", Angew. Chem. Int. Ed. 2001, 40, No. 9, 1721-1725. (2001).

Niyogi et al. "Ultrasonic Dispersions of Single-Walled Carbon Nanotubes" J. Phys. Chem B 2003, 107, 8799-8804.

Matarredona, O., et al., "Dispersion of Single-Walled Carbon Nanotubes in Aqueous Solutions of the Anionic Surfactant NaDDBS", J. Phys. Chem B 2003, 107, 13357-13367.

Hirsch, A., "Functionalization of Single-Walled Carbon Nanotubes", Agnew Chem. Int. Ed. 2002, 41, No. 11, 1853-1859.

Vivekchand et al., A New Method of Preparing Single-Walled Carbon Nanotubes, Proc. Indian Acad. Sci (Chem. Sci.), vol. 115, Nos. 5 & 6, Oct.-Dec. 2003, 509-518.

Jason E. Riggs, et al., Optical Limiting Properties of Suspended and Solubilized Carbon Nanotubes, J. Phys. Chem, B 2000, 104, 7071-7076.

Wonderous World of Carbon Nanotubes, http://students.chem.tue.nl/ifp03/purification.html, printed May 20, 2004, 1-11.

R. Colin Johnson, IBM Grows Nanotube Patterns on Silicon Wafers, EETimes, Sep. 30, 2002.

MT Martinez, et al., Modifications of Single-Wall Carbon Nanotubes Upon Oxidative Purification Treatments, http://www.iop.org/EJ/abstract/0957-4484/14/7/301, printed May 20, 2004.

Multifunctional Carbon Nanotube Composites, http://www.ornl.gov/~odg/compositesmain.html, printed May 20, 2004, 1-5.

Francisco Pompeo et al., "Water Solubilization of Single-Walled Carbon Nanotubes by Functionalization with Glucosamine", Nano Lett. 2002, vol. 2, No. 4, 369-373.

Sun, Y.-P., et al., "Soluble Dendron-Functionalized Carbon Nanotubes: Preparation, Characterization, and Properties", Chem. Mater. 2001, 13, 2864-2869.

Riggs, J. E., et al., "Strong Luminescence of Solubilized Carbon Nanotubes", J. Am. Chem. Sco. 2000, 122, 5879-5880.

Vasilios Georgakilas, "Organic Functionalization of Carbon Nanotubes", vol. 124, No. 5, 2002 9 J. Am. Chem. Soc., 760-761.

M. F. Islam, et al., "High Weight Fraction Surfactant Solubilization of Single-Wall Carbon Nanotubes in Water", Nano Lett. 2003, vol. 3, No. 2, 269-273.

Moore, V.C., "Individually Suspended Single-Walled Carbon Nanotubes in Various Surfactants", Nano Lett. 2003, vol. 3, No. 10, 1379-1382.

Sun, Y., "High Dissolution and Strong Light Emission of Carbon Nanotubes in Aromatic Amine Solvents", J. Am. Chem. Soc. 2001, 123, 5348-5349.

Chen, J, et al., "Solution Properties of Single-Walled Carbon Nanotubes", Science vol. 282, 95-98 (1998).

Ajayan et al., "Application of Carbon Nanotubes," Carbon Nanaotubes, Topics Appl. Phys. vol. 80, pp. 391-425, Springer-Verlag Berlin Heidelberg (2001).

Banerjee et al., "Functionalization of Carbon Nanotubes with a Metal-Containing Molecular Complex," Nano Letters, vol. 2, No. 1, pp. 49-53 (2002).

Berhan et al., "Mechanical properties of nanotubes sheets: Alterations in joint morphology and achievable moduli in manufacturable materials," Journal of applied Physics, vol. 95, No. 8, pp. 4335-4345 (Apr. 15, 2004).

Casseil et al., "Large Scale CVD Synthesis of Single-Walled Carbon Nanotubes," J. Phys. Chem. B., vol. 103, pp. 6484-6492 (1999).

Chen et al., "Heterogeneous Single-Walled Carbon Nanotube Catalyst Discovery and Optimization," Chem. Mater, vol. 14, pp. 1891-1896 (2002).

Cheng, "Large-scale and low cost synthesis of single-walled carbon nanotubes by the catalytic pyrolysis of hydrocarbons," Applied Physics Letters, vol. 72, No. 25, pp. 3282-3284 (Jun. 22, 1998).

Chiang et al., "Purification and Characterization of Single-Wall Carbon Nanotubes,", J. Phys. Chem B., vol. 105, pp. 1157-1161 (2001).

Colomer et al., "Different purification methods of carbon nanotubes produced by catalytic systhesis," Synthetic Metals, vol. 103, pp. 2482-2483 (1999).

Delzeit et al., "Multilayered metal catalysts for controlling the density of single-walled carbon nanotubes growth," Chemical Physics letters, vol. 348, pp. 368-374, Nov. 16, 2001.

Desai et al., "Frestanding Carbon Nanotube Specimen Fabrication," Proc. of 2005, 5th IEEE Conf. nanotech, Nagoya, Japan, Jul. 2005, pp. 1-4.

Dillion et al., "A simple and Complete Purification of Single-Walled Carbon Nanotube Materials," Advanced Materials, vol. 11, No. 16, pp. 1354-1358 (1999).

Gromov, "Purification of Carbon nanotubes trends and methods," Caramel workshop, 13 pages, Jan. 23, 2002.

Haddon et al., "Purification and Seperation of Carbon Nanotubes," MRS Bulletin,, pp. 252-259, Apr. 2004.

Hafner et al., "Catalytic growth of single-wall carbon nanotubes from metal particles," Chemical Physics Letters, vol. 296, pp. 195-202 (1998).

Hou et al., "Multi-step Purification of carbon nanotubes of Carbon nanotubes," Carbon, vol. 40, pp. 81-85 (2002).

International Search Report and Written Opinion for International Patent Application PCT/US05/18467, mailed Oct. 1, 2007.

International Search Report, International Application No. PCT/US05/18465, mailed Aug. 21, 2006 3 pages.

International Search Report, International Searching Authority, for International Application PCT/US05/18539, mailed Sep. 18, 2006 4 pages.

Jeong et al., "A new purification method of single-wall carbon nanotubes using H2S and O2 mixture gas," Chemical Physics Letters, vol. 344, pp. 18-22, Aug. 17, 2001.

Khan et al., "Solubilization of Oxidized Single-Walled Carbon Nanotubes in Organic and aqueous Solvents through Organic Derivation," Nano Letters, vol. 2, No. 11, pp. 1215-1218 (2002).

Kong et al., "Chemical vapor deposition of methane for single-walled carbon nanotubes," Chemical Physics Letters, vol. 292, pp. 567-574 (1998).

Murphy et al., "High-Yield, Nondestrutive Purification and Quantification Method for Multiwalled Carbon Nanotubes," J. Phys. Chem B., vol. 106, pp. 3087-3091 (2002).

Shelimov et al., "Purification of single-wall carbon nanotubes by ultrasonically assisted filtration," Chemical Physics Letters, vol. 282, pp. 429-434, Jan. 23, 1998.

United States Patent and Trademark Office, International Search Report for PCT/US2005/045316 mailed Sep. 6, 2006, 2 pages.

Ago et al., "Workfunction of Purified and Oxidised Carbon Nanotubes," Synthetic Metals, vol. 103, pp. 2494-2495 (1999).

Kong et al.,"Nanotube Molecular Wires as Chemical Sensors," Science, vol. 287, pp. 622-625, Jan. 28, 2000.

* cited by examiner

SPIN-COATABLE LIQUID FOR FORMATION OF HIGH PURITY NANOTUBE FILMS

CROSS-REFERENCE TO RELATED APPLICATIONS

This application is related to the following applications, all of which are assigned to the assignee of this application, and all of which are incorporated by reference in their entirety: Nanotube Films and Articles (U.S. Pat. No. 6,706, 402) filed Apr. 23, 2002; Methods of Nanotube Films and Articles (U.S. patent application Ser. No. 10/128,117) filed Apr. 23, 2002; and Patterning of Nanoscopic Articles (U.S. Provisional Patent Appl. No. 60/501,033) filed on Sep. 8, 2003.

BACKGROUND

1. Technical Field

This invention describes spin-coatable liquids for use in the preparation of nanotube films. Such liquids are used in creating films and fabrics of nanotubes or mixtures of nanotubes and other materials on a variety of substrates including silicon, plastics, paper and other materials. In particular, the invention describes spin-coatable liquids containing nanotubes for use in electronics fabrication processes. Furthermore, the spin-coatable liquids meet or exceed specifications for a semiconductor fabrication facility, including a class 1 environment.

2. Discussion of Related Art

Nanotubes are useful for many applications; due to their electrical properties nanotubes may be used as conducting and semi-conducting elements in numerous electronic elements. Single walled carbon nanotubes (SWNTs) have emerged in the last decade as advanced materials exhibiting interesting electrical, mechanical and optical properties. However, the inclusion or incorporation of the SWNT as part of standard microelectronic fabrication process has faced challenges due to a lack of a readily available application method compatible with existing semiconductor equipment and tools and meeting the stringent materials standards required in the electronic fabrication process. Standards for such a method include, but are not limited to, non-toxicity, non-flammability, ready availability in CMOS or electronics grades, substantially free from suspended particles (including but not limited to submicro- and nanoscale particles and aggregates), and compatible with spin coating tracks and other tools currently used by the semiconductor industry.

Individual nanotubes may be used as conducting elements, e.g. as a channel in a transistor, however the placement of millions of catalyst particles and the growth of millions of properly aligned nanotubes of specific length presents serious challenges. U.S. Pat. Nos. 6,643,165 and 6,574,130 describe electromechanical switches using flexible nanotube-based fabrics (nanofabrics) derived from solution-phase coatings of nanotubes in which the nanotubes first are grown, then brought into solution, and applied to substrates at ambient temperatures. Nanotubes may be derivatized in order to facilitate bringing the tubes into solution, however in uses where pristine nanotubes are necessary, it is often difficult to remove the derivatizing agent. Even when removal of the derivatizing agent is not difficult, such removal is an added, time-consuming step.

There have been few attempts to disperse SWNTs in aqueous and non-aqueous solvents. Chen et al. first reported solubilization of shortened, end-functionalized SWNTs in solvents such as chloroform, dichloromethane, orthodichlorobenzene (ODCB), CS2, dimethyl formamide (DMF) and tetrahydrofuran (THF). See, "Solution Properties of Single-Walled Nanotubes", Science 1998, 282, 95-98. Ausman et al. reported the use of SWNTs solutions using sonication. The solvents used were N-methylpyrrolidone (NMP), DMF, hexamethylphosphoramide, cyclopentanone, tetramethylene sulfoxide and ε-caprolactone (listed in decreasing order of carbon nanotube solvation). Ausman at el. generally conclude that solvents with good Lewis basicity (i.e., availability of a free electron pair without hydrogen donors) are good solvents for SWNTs. See, "Organic Solvent Dispersions of Single-Walled Carbon Nanotubes: Toward Solutions of Pristine Nanotubes", J. Phys. Chem. B 2000, 104, 8911. Other early approaches involved the fluorination or sidewall covalent derivatization of SWNTs with aliphatic and aromatic moieties to improve nanotube solubility. See, e.g., E. T. Mickelson et al., "Solvation of Fluorinated Single-Wall Carbon Nanotubes in Alcohol Solvents", J. Phys. Chem. B 1999, 103, 4318-4322.

Full-length soluble SWNTs can be prepared by ionic functionalization of the SWNT ends dissolved in THF and DMF. See, Chen et al., "Dissolution of Full-Length Single-Walled Carbon Nanotubes", J. Phys. Chem. B 2001, 105, 2525-2528 and J. L. Bahr et al Chem. Comm. 2001, 193-194. Chen et al. used HiPCO™ as-prepared (AP)-SWNTs and studied a wide range of solvents. (HiPCO™ is a trademark of Rice University for SWNTs prepared under high pressure carbon monoxide decomposition). The solutions were made using sonication.

Bahr et al. ("Dissolution Of Small Diameter Single-Wall Carbon Nanotubes In Organic Solvents?", Chem. Commun., 2001, 193-194) reported the most favorable solvation results using ODCB, followed by chloroform, methylnaphthalene, bromomethylnaphthalene, NMP and DMF as solvents. Subsequent work has shown that good solubility of AP-SWNT in ODCB is due to sonication-induced polymerization of ODCB, which then wraps around SWNTs, essentially producing soluble polymer wrapped (PW)-SWNTs. See Niyogi et al., "Ultrasonic Dispersions of Single-Walled Carbon Nanotubes", J. Phys. Chem. B 2003, 107, 8799-8804. Polymer wrapping usually affects sheet resistance of the SWNT network and may not be appropriate for electronic applications where low sheet resistance is desired. See, e.g., A. Star et al., "Preparation and Properties of Polymer-Wrapped Single-Walled Carbon Nanotubes", Angew. Chem. Int. Ed. 2001, 40, 1721-1725 and M. J. O'Connell et al., "Reversible Water-Solubilization Of Single-Walled Carbon Nanotubes By Polymer Wrapping", Chem. Phys. Lett. 2001, 342, 265-271.

While these approaches were successful in solubilizing the SWNTs in a variety of organic solvents to practically relevant levels, all such attempts resulted in the depletion of the π electrons that are essential to retain interesting electrical and optical properties of nanotubes. Other earlier attempts involve the use of cationic, anionic or non-ionic surfactants to disperse the SWNT in aqueous and non-aqueous systems. See, Matarredona et al., "Dispersion of Single-Walled Carbon Nanotubes in Aqueous Solutions of the Anionic Surfactant", J. Phys. Chem. B 2003, 107, 13357-13367. While this type of approach has helped to retain the electrical conductivity and optical properties of the SWNTs, most such methods leave halogens or alkali metals or polymeric residues, which tend to severely hamper any meaningful use in microelectronic fabrication facilities.

There is a need for a method of solvating or dispensing nanotubes in solvents for use in electronics applications.

There remains a further need for methods that meet the criteria outlined above for low toxicity, purity, cleanliness, ease of handling and scalability.

SUMMARY OF THE INVENTION

One aspect of the present invention is directed to spin-coatable liquids for formation of high purity nanotube films.

According to one aspect of the present invention, a composition of nanotubes for use in an electronics fabrication process includes a liquid medium containing a plurality of nanotubes pretreated to reduce the level of metal and particulate impurities to a preselected level. The solvents are present at commercially meaningful levels, e.g., the nanotubes are at a concentration of greater than 1 mg/L. The nanotubes are homogeneously distributed in the liquid medium without substantial precipitation or flocculation.

In one aspect of the present invention, a nanotube composition includes a stable distribution of nanotubes in a liquid medium and is substantially free of particulate and metallic impurities. The level of particulate and metallic impurities is commensurate with preselected fabrication requirements.

In one aspect of the invention, a spin-coatable liquid for formation of a nanotube film is provided including a liquid medium containing a controlled concentration of purified nanotubes, wherein the controlled concentration is sufficient to form a nanotube fabric or film of preselected density and uniformity, and wherein the spin-coatable liquid comprises less than $1 \times 10^{18}$ atoms/cm$^3$ of metallic impurities.

In another aspect of the invention a spin-coatable liquid for formation of a nanotube film is provided including a liquid medium containing a distribution of nanotubes, wherein the nanotubes remain separate from one another without precipitation or flocculation for a time sufficient to apply the spin-coatable liquid to a surface, and wherein the spin-coatable liquid is substantially free of particle impurities having a diameter of greater than about 500 nm.

In another aspect of the invention, a fullerene composition includes a liquid medium containing a distribution of fullerenes, wherein the fullerenes remain separate from one another without precipitation or flocculation for a time sufficient to apply the fullerene composition to a surface, and wherein the composition comprises less than $1 \times 10^{18}$ atoms/cm$^3$ of metal impurities.

The fabrication processes can have varying requirements for solvent and raw material composition and purity. According to one aspect of the present invention, spin-coatable liquids containing fullerenes or nanotubes of varying composition and purity are provided for use in these fabrication processes having varying processing specifications and environmental requirements.

According to one aspect of the present invention, methods and compositions for creating nanotube compositions for use in fabrication facilities having high standards of non-toxicity and purity are provided. Such processes include semiconductor fabrication processes, for example, CMOS and advanced logic and memory fabrications. Such fabrication processes may produce devices having fine features, e.g., $\leq 250$ nm.

According to other aspects of the present invention, the nanotube compositions are of a purity that is suitable for use in electronics fabrication facilities having less stringent standards for chemical composition and purity. Such processes include, for example, interconnect fabrication and fabrication of chemical and biological sensors.

BRIEF DESCRIPTION OF THE DRAWING

The invention is described with reference to the Drawing, which is presented for the purpose of illustration only and which is not intended to be limiting of the invention.

DETAILED DESCRIPTION OF THE INVENTION

Figure 1:
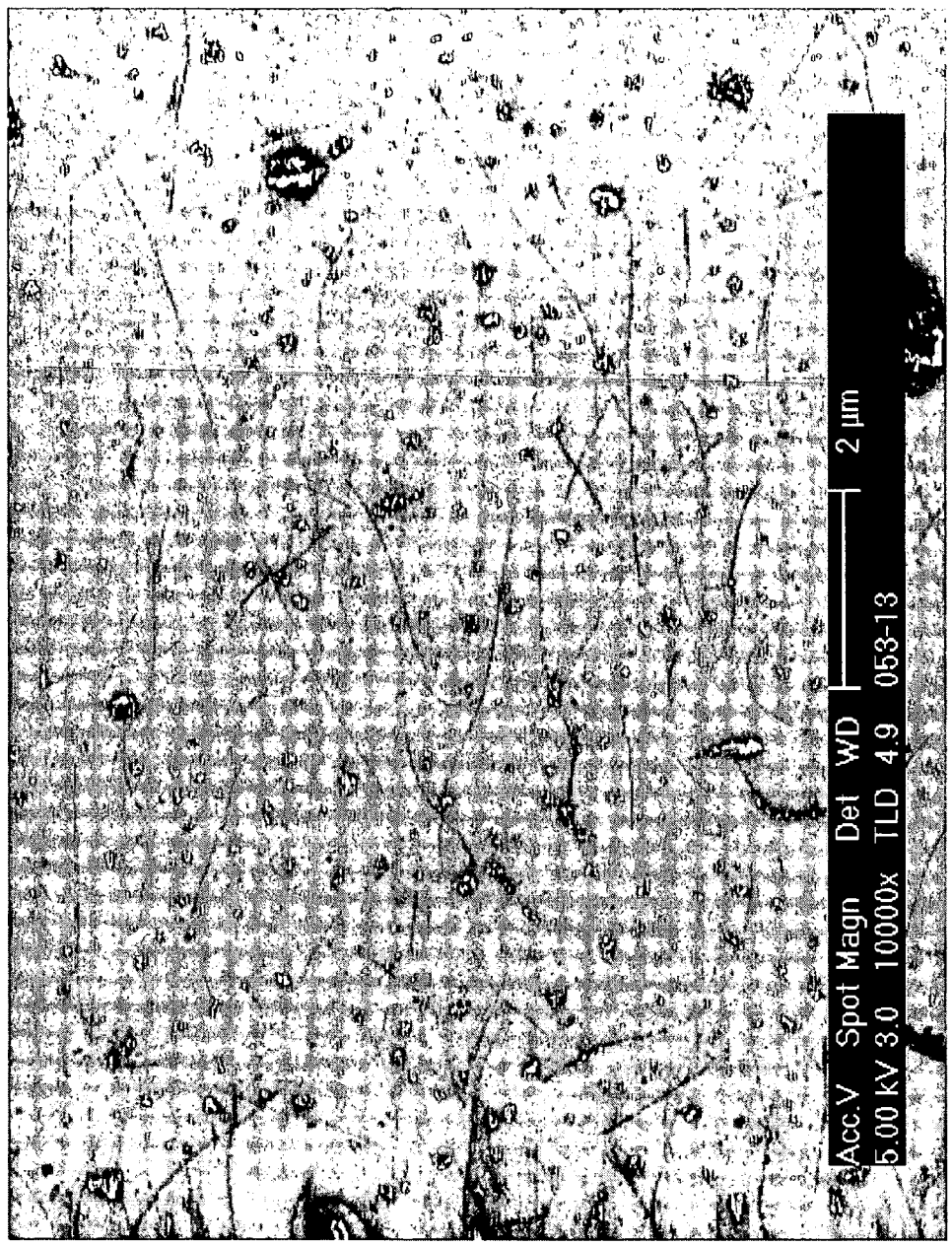
FIG. 1 illustrates a typical scanning electron micrograph (SEM) of an unpurified nanotube fabric.

Nanotubes have been the focus of intense research efforts into the development of applications that take advantage of their electronic, biological, and/or material properties. In one or more embodiments, a spin-coatable liquid containing a controlled concentration of purified nanotubes is prepared in a liquid medium. The spin-coatable liquid may be used to create nanotube films and fabrics of substantially uniform porosity. Certain embodiments provide spin-coatable liquids having a purity level that is commensurate with the intended application. Other applications provide spin-coatable liquids meeting or exceeding specifications for class 1 semiconductor fabrication.

In one or more embodiments, a nanotube composition includes a liquid medium containing a mixture of single-walled or multi-walled nanotubes that is stable enough for certain intended applications, such as spin coating in a class 1 production facility. The nanotubes in the nanotube composition remain suspended, dispersed, solvated or mixed in a liquid medium without substantial precipitation, flocculation or any other macroscopic interaction that would interfere with the ability to apply the nanotube solution to a substrate and form a uniform porosity. If there were significant precipitation or aggregation of the nanotubes, the nanotubes would clump together and form non-uniform films, which would be undesirable. The nature by which the nanotubes interact with the solvent to form a stable composition is not limited. Thus, for example, the nanotubes may be suspended or dispersed in the solvent or they may be solvated or solubilized in the solvent. The stable nanotube composition typically forms a homogeneous distribution of nanotubes in the solvent.

At the present time, it is desirable that the nanotubes remain distributed in the solvent medium without substantial precipitation, flocculation or other macroscopic interaction, for at least one hour, or for at least 24 hours, or even for at least one week. Substantial precipitation and flocculation and the like can be detected by a variety of methods. Precipitates and aggregates can be detected by visual inspection. Alternatively, precipitation or flocculation can be detected by analytical techniques, such light scattering or absorbance, or by observation of nanotubes once they are deposited on a substrate from the nanotube solution. A stable nanotube composition can exhibit prolonged suspension (typically several weeks to few months) of the SWNT in the medium with little or no detectable change in the scattered light intensity, or absorbance at a given wavelength, or viscosity.

Light scattering is measured using a monochromatic beam of light traveling through the solution. A change of light scattering intensity over time is recorded usually by a detector placed normal to the beam direction or from multiple detectors placed at various angles including the right angle. Another indicator especially at low concentrations of SWNT is the fall in absorbance (at a given wavelength) as function of time. For higher concentrations of the solution, between the semidilute and nematic regimes, precipitation of individually suspended tubes leads to a noticeable fall in the viscosity of the suspension. Other methods of determining the stability of a nanotube composition for its intended purpose will be apparent to those of skill in the art.

The nanotubes used in one or more embodiments of the present invention may be single walled nanotubes or multi-walled nanotubes and may be of varying lengths. The nanotubes may be conductive, semiconductive or combinations thereof. Conductive SWNTs are useful in the manufacture of nanotube films, articles and devices and can be used in the nanotube solutions according to one or more embodiments of the invention. Thus, the nanotube composition is integratable into current electronic fabrication processes including, by way of example, CMOS, bipolar-transistor, advanced memory and logic device, interconnect device, and chemical and biological sensor fabrications.

In selecting a solvent for the nanotube composition, the intended application for the nanotube composition is considered. The solvent meets or exceeds purity specifications required in the fabrication of intended application. The semiconductor manufacturing industry demands adherence to the specific standards set within the semiconductor manufacturing industry for ultra-clean, static-safe, controlled humidity storage and processing environments. Many of the common nanotube handling and processing procedures are simply incompatible with the industry standards. Furthermore, process engineers resist trying unfamiliar technologies. According to one aspect of the present invention, a solvent for use in a nanotube composition is selected based upon its compatibility or compliance with the electronics and/or semiconductor manufacturing industry standards.

Exemplary solvents that are compatible with many semiconducting fabrication processes, including but not limited to CMOS, bipolar, biCMOS, and MOSFET, include ethyl lactate, dimethyl sulfoxide (DMSO), monomethyl ether, 4-methyl-2 pentanone, N-methylpyrrolidone (NMP), t-butyl alcohol, methoxy propanol, propylene glycol, ethylene glycol, gamma butyrolactone, benzyl benzoate, salicyladehyde, tetramethyl ammonium hydroxide and esters of alpha-hydroxy carboxylic acids. In one or more embodiments, the solvent is a non-halogen solvent, or it is a non-aqueous solvent, both of which are desired in certain electronic fabrication processes. In one or more embodiments, the solvent disperses the nanotubes to form a stable composition without the addition of surfactants or other surface-active agents.

In one aspect of the invention, nanotube compositions include a plurality of single-walled or multi-walled nanotubes in ethyl lactate as the solvent. Ethyl lactate is one among the common solvent systems used by the electronics and electronic packaging industry and is an industry-accepted solvent that meets the industry standards for safety and purity. Ethyl lactate is available as a high purity solvent, or it can be purified to acceptable purity levels. Ethyl lactate has surprisingly been shown to exhibit excellent solubilizing capabilities for nanotubes. Furthermore, ethyl lactate can form stable nanotube compositions even in the presence of significant levels of impurities, thereby providing a versatile solution for application for formation of nanotube films and fabrics in a variety of applications. In one or more embodiments of the present invention, a nanotube solution of SWNT in ethyl lactate is provided. Purified SWNTs can be solubilized in ethyl lactate at high concentrations, e.g., 100 mg/L, or even higher. Nanotube compositions include nanotubes homogeneously distributed in ethyl lactate without significant precipitation or flocculation.

Typical nanotube concentrations range from about 1 mg/L to 100 g/L, or from about 1 mg/L to 1 g/L, or about 10 mg/L, or about 100 mg/L, or even about 1000 mg/L with a common concentration used for memory and logic applications of 100 mg/L. Such a concentration is exemplary various useful concentrations ranges depend upon the application. For example in the case where a monolayer fabrics is desired one could use a less concentrated composition with a single or a few applications of the nanotube composition, e.g., by spin coating, to the substrate. In the event that a thick multilayer fabric is desired, a spraying technique could be employed with a nearly saturated nanotube composition. The concentration is, of course, dependent upon the specific solvent choice, method of nanotube dispersion and type of nanotube used, e.g., single-walled or multiwalled.

Nanotubes may be prepared using methods that are well known in the art, such as for example, chemical vapor deposition (CVD) or other vapor phase growth techniques (electric-arc discharge, laser ablation, etc.). Nanotubes of varying purity may also be purchased from several vendors, such as Carbon Nanotubes, Inc., Carbolex, Southwest Nanotechnologies, EliCarb, Nanocyl, Nanolabs, and BuckyUSA (a more complete list of carbon nanotube suppliers is found at http://www.cus.cam.ac.uk/~cs266/list.html). Vapor-phase catalysts are typically used to synthesize nanotubes and, as a result, the nanotubes are contaminated with metallic impurities. Furthermore, formation of nanotubes may also be accompanied by the formation of other carbonaceous materials, which are also a source of impurities in the nanotubes.

In one or more embodiments of the present invention, metallic particles and amorphous carbon particles are separated from nanotubes. The purification process reduces alkali metal ions, halogen ions, oligomers or polymers as active or inactive chemical components as part of the SWNT solution. The nanotube solutions according to certain embodiments of the present invention are substantially free of high levels of these particulate and/or insoluble materials (as well as other soluble materials that are incompatible with the semiconducting fabrication process). The nanotube solutions are thus purified for use in CMOS processing or other semiconducting fabrication process.

Appropriate purification techniques desirably remove impurities without affecting the nanotube chemical structure or electronic properties. Impurities may be removed for example, by dispersing the nanotubes in dilute acid solution to dissolve metal impurities, followed by separation of the nanotubes from the metallic solution. A mild acid treatment with nitric acid or hydrochloric acid may be used. Other suitable methods for metal removal include magnetic purification. Amorphous carbon may be removed, for example, by a combination of high speed centrifugation using an ultracentrifuge and filtration techniques for example but not limited to gravity filtration, cross flow filtration, vacuum filtration and others. Other suitable purification techniques include the preferential oxidation of non-fullerenic carbonaceous materials. Multiple purification steps may be desired in order to obtain nanotubes of a purity for use in a CMOS-grade nanotube solution. See, for example, Chiang, et al., J. Phys.ChemB 105, 1157 (2001); and Haddon, et al., MRS Bulletin, April 2004)

In one or more embodiments, nanotubes are pretreated to reduce the metallic impurity levels to preselected levels.

In one or more embodiments, the nanotubes composition contains less than about $10^{18}$ atoms/cm$^3$ of metal impurities, or less than about $10^{16}$ atoms/cm$^3$ of metal impurities, or less than about $10^{14}$ atoms/cm$^3$ of metal impurities, or less than about $10^{12}$ atoms/cm$^3$ of metal impurities, or less than about $10^{10}$ atoms/cm$^3$ of metal impurities. Compositions having lower levels of metallic impurities, e.g. ca. $10^{10}$-$10^{12}$ atoms/cm$^3$, may be used in the manufacture of advanced devices having fine features, for example, devices having features of less than or equal to 250 nm.

Heavy metals, for examples metals having a specific gravity of 5 g/ml, are generally toxic in relatively low concentrations to plant and animal life and tend to accumulate in the food chain. Examples include lead, mercury, cadmium, chromium, and arsenic. Such compounds are carefully regulated in the semiconductor fabrication industry and are desirably maintained at minimum levels. In one or more embodiments, the nanotube composition includes less than about $10^{18}$ atoms/cm$^3$ of heavy metal impurities, or less than about $10^{16}$ atoms/cm$^3$ of heavy metal impurities, or less than about $10^{14}$ atoms/cm$^3$ of heavy metal impurities, or less than about $10^{12}$ atoms/cm$^3$ of heavy metal impurities or even less than about $15 \times 10^{10}$ atoms/cm$^3$ of heavy metal impurities.

Similarly, the concentration of group I and group II elements is regulated due to the deleterious effect of elements such as sodium, potassium, magnesium and calcium, and the like, on the performance characteristics of the electronic device. In one or more embodiments, the nanotube composition includes less than about $10^{18}$ atoms/cm$^3$ of group I and group II element impurities, or less than about $10^{16}$ atoms/cm$^3$ of group I and group II element impurities, or less than about $10^{14}$ atoms/cm$^3$ of group I and group II element impurities, or less than about $10^{12}$ atoms/cm$^3$ of group I and group II element impurities or even less than about $15 \times 10^{10}$ atoms/cm$^3$ of group I and group II element impurities.

Lastly, transition metals are also avoided due to their ready migration and the deleterious effect of such migration to the device performance. See, Mayer, et al. Electronic Materials Science: For Integrated Circuits in Si and GaAs, 2nd Ed, Macmilliam, New York, 1988. As is the case for heavy metals and group I and group II metals, it is desired to maintain the impurity level of transition metals, such as copper, iron, cobalt, molybdenum, titanium and nickel, to less than preselected values. In one or more embodiments of the present invention, the nanotube composition includes less than about $10^{18}$ atoms/cm$^3$ of transition metal impurities, or less than about $10^{16}$ atoms/cm$^3$ of transition metal impurities, or less than about $10^{14}$ atoms/cm$^3$ of transition metal impurities, or less than about $10^{12}$ atoms/cm$^3$ of transition metal impurities or even less than about $15 \times 10^{10}$ atoms/cm$^3$ of transition metal impurities.

The impurity content of the nanotubes can be monitored using conventional methods, such as transmission electron microscopy (TEM) and scanning electron microscopy (SEM) and using analytical techniques such as x-ray microanalysis (EDAX), or Vapor Phase Decomposition and Inductively-Coupled Plasma Mass Spectrometry (VPD, ICP/MS).

Metallic impurity levels may be measured using conventional methods such as EDAX and VPD, IPC/MS. If large quantities of solution (e.g., > about 1000 mL), are available for testing, direct volumetric concentration measurements (atoms/cm$^3$) can be determined. Alternatively, a known volume of the composition may be deposited over a known surface area and the surface impurity concentration (atoms/cm$^2$) can be determined.

In other embodiments of the present invention, nanotubes are pretreated to reduce the particulate impurities levels to a preselected level. The semiconductor industry has established standardized particulate impurity levels for particular processes, and the nanotubes may be pretreated to reduce the nanotube particulate levels to below the accepted levels. In one or more embodiments, the composition is substantially free of particle impurities having a diameter of greater than about 5 micron (μm), or about 1 μm, or about 3 μm, or about 500 nm, or 300 nm, or 100 nm, or even 45 nm.

Guidelines for particulate and metal impurity levels are found in the International Technology Roadmad for Semiconductors (ITRS Roadmap). For example, the ITRS Roadmap states that at the 65 nm DRAM ½ pitch, the critical particle size is 33 nm and only 1 particle/m$^3$ is allowed over the critical size. From the ITRS 2002 update, at the 90 nm DRAM ½ pitch node, the critical particle size is 45 nm with only 2 particles/m$^3$ allowed above the critical particle dimension. The ITRS Roadmap for 90 nm DRAM ½ pitch mode allows for $<15 \times 10^{10}$ atoms/cm3 of metal contamination during fabrication. Liquid chemicals utilized for wafer fabrication may contribute <10 particles/mL of surface contamination. Other fabrication specifications may be identified by the ITRS.

The semiconductor industry has well-established testing protocols for monitoring the particulate levels at, for example, 5 μm, 3 μm, 1 μm, 500 nm, 300 nm and 100 nm. The metrology employed for detecting the particulate contaminate will have a resolution of 0.2 nm. Typical equipment include KLA Tencor surfscan™ and the like. Such testing methods and equipment may be readily adapted for use in evaluating the particulate levels of nanotube compositions.

In one or more embodiments of the present invention, the nanotube composition is a homogeneous mixture of purified single walled carbon nanotubes in ethyl lactate at concentrations high enough to be useful in practical applications in the electronics industry, e.g., $\geq 10$ mg/L. The nanotube composition can be electronics-grade purity. In some embodiments, nanotubes purified to an impurity content of less than 0.2 wt %, or less than 0.1 wt % free metal are solubilized in electronics-grade ethyl lactate or other suitable solvent.

It has been surprisingly discovered that nanotubes that have been pretreated to reduce the metallic and particulate impurity levels to below preselected levels, such as described herein, can form stable nanotube dispersions in a variety of solvents. Nanotubes, by way of example, SWNTs, and further by way of example purified SWNT, may be solubilized by dispersion in the appropriate solvent. One or more steps of grind or agitating the nanotubes in the selected solvent and sonication may enhance solubilization.

The solution is appropriate for use as a spin-on SWNT solution for electronic and electronic packaging applications. The inventors envision that the addition of various optional additives may be useful to facilitate long term storage and stabilization properties of carbon nanotube solutions. Such additives include, but are not limited to stabilizers, surfactants and other chemicals known or accepted as additives to solutions used for fabrication of electronics. The nanotube solution according to one or more embodiments of the present invention and the methods of making the solution of nanotubes have been standardized for CMOS compatibility as required in conventional semiconductor fabrication systems, i.e. the chemicals, spin coating tracks and other related machineries necessary to create the solutions of the present invention may be found in typical CMOS processing facilities or more generally may be present in many types of services common to the electronics industry including fabrication and packaging facilities.

The nanotube composition can be placed or applied on a substrate to obtain a nanotube film, fabric or other article. A conductive article includes an aggregate of nanotubes (at least some of which are conductive), in which the nanotubes contact other nanotubes to define a plurality of conductive pathways in the article. The nanotube fabric or film desirably has a uniform porosity or density. In many applications, the nanotube fabric is a monolayer.

Many methods exist for the application procedure including spin coating, spray coating, dipping and many others known for dispersing solutions onto substrates. For thicker fabrics beyond a monolayer, more applications or more concentrated solutions may be required. In fact other techniques for application of the fabric may be required as has been outlined elsewhere (See Nanotube Films and Articles (U.S. Pat. No. 6,706,402) filed Apr. 23, 2002 and Methods of Nanotube Films and Articles (U.S. patent application Ser. No. 10/128,117) filed Apr. 23, 2002).

In one aspect of the invention, a highly purified nanotube article is provided. The article contains a network of contacting nanotubes for form pathway through the article. The nanotube network may form a ribbon or non-woven fabric. The article contains less than 0.2 wt % or 0.1 wt % free metal, or even less.

In one or more embodiments, the nanotubes article contains less than about $10^{18}$ atoms/cm$^2$ of metal impurities, or less than about $10^{16}$ atoms/cm$^2$ of metal impurities, or less than about $10^{14}$ atoms/cm$^2$ of metal impurities, or less than about $10^{12}$ atoms/cm$^2$ of metal impurities, or less than about $10^{10}$ atoms/cm$^2$ of metal impurities. Compositions having lower levels of metallic impurities, e.g. ca. $10^{10}$-$10^{12}$ atoms/cm$^2$, may be used in the manufacture of advanced devices having fine features, for example, devices having features of less than or equal to 250 nm.

Heavy metals, for examples metals having a specific gravity of 5 g/ml, are generally toxic in relatively low concentrations to plant and animal life and tend to accumulate in the food chain. Examples include lead, mercury, cadmium, chromium, and arsenic. Such compounds are carefully regulated in the semiconductor fabrication industry and are desirably maintained at minimum levels. In one or more embodiments, the nanotube article includes less than about $10^{18}$ atoms/cm$^2$ of heavy metal impurities, or even less than about $15\times10^{10}$ atoms/cm$^2$ of heavy metal impurities.

Similarly, the concentration of group I and group II elements is regulated due to the deleterious effect of elements such as sodium, potassium, magnesium and calcium, and the like, on the performance characteristics of the electronic device. In one or more embodiments, the nanotube article includes less than about $10^{18}$ atoms/cm$^2$ of group I and group II element impurities, or even less than about $15\times10^{10}$ atoms/cm$^2$ of group I and group II element impurities.

Lastly, transition metals are also avoided due to their ready migration and the deleterious effect of such migration to the device performance. As is the case for heavy metals and group I and group II metals, it is desired to maintain the impurity level of transition metals, such as copper, iron, cobalt, molybdenum, titanium, and nickel, to less than preselected values. In one or more embodiments of the present invention, the nanotube article includes less than about $10^{18}$ atoms/cm$^2$ of transition metal impurities, or even less than about $15\times10^{10}$ atoms/cm$^2$ of transition metal impurities.

The use of the term "about" reflects the variation that occurs in measurement and can range up to 30% of the measured value. For example, when determining metal impurity levels using VPD ICP-MS, the accuracy of the measurement is related to the precision of analytical signals, the recovery of trace metals from the wafer surface, and the accuracy of the standards used. Overall accuracy of the VPD ICP-MS technique varies from ±15%, at concentration levels higher than 10 times above the method detection limit, to ±30% or higher at concentration levels lower than 10 times the detection limits. Similar variability is expected in other measurements.

The following example are provided to illustrate the invention, which is not intended to be limiting of the invention, the scope of which is set forth in the claims which follow.

EXAMPLE 1

This example describes the purification of nanotubes.

Single-walled carbon nanotubes (SWNTs) were purified by stirring in 7.7M HNO$^3$ for 8 h followed by refluxing at 125° C. for 12 h. The acid refluxed material was washed with DI water three times by a sonication-centrifugation-decantation cycle. The DI water washed material was then vacuum filtered over a 5 micron filter until a dried SWNT membrane was obtained on the filter paper. This purified SWNT material was collected and used for making a SWNT composition.

EXAMPLE 2

This example describes the preparation of a nanotube composition and a nanotube article.

In order to avoid recontamination of the nanotubes, clean room conditions, for example, Class 100 or greater, were maintained during preparation and processing of the nanotube composition. Twenty-one mg of single-walled nanotubes (SWNTs), purified as described above in Example 1 were soaked in 10 mL ethyl lactate (electronics grade—Sigma), ground with a mortar and pestle, sonicated and centrifuged to remove the supernatant. These steps were repeated as necessary to solubilize the carbon nanotubes. The solubilized nanotubes had a final concentration of 21 mg carbon nanotubes per 250 mL ethyl lactate, and the optical density at 550 nm of the solution was measured to be 1.001.

Each individual step of the solubilization process is detailed in the Table 1 for the solubilization of SWNTs in ethyl lactate (EL). This protocol is illustrative of one means of forming a solubilized nanotube solution. Many other methods of forming such a solution are possible by adding or subtracting steps involving agitation and solubilization depending upon the specific requirements for concentration, solution stability and ultimate performance metrics of the desired fabric.

TABLE 1

Process Flow Chart for SWNT solubilization in Ethyl-Lactate

| Step | Process | Duration | Remarks |
|---|---|---|---|
| 1 | Soak in 10 ml EL | 30 min | In mortar |
| 2 | Grind | 10 min | In mortar |
| 3 | Soak in 10 ml EL | 1 h 20 min | In mortar |
| 4 | Add 90 ml EL | | After transfer to 250 ml flask |
| 5 | Bath sonicate | 0.5 h | 5° C. |
| 6 | Centrifuge (10 krpm, 20° C.) | 0.5 h | In Teflon container |
| 7 | Decant supernatant | | Collect in 500 ml flask (100 ml); 25 C. |
| 8 | Grind sediment in 10 ml EL | 10 min | In mortar |
| 9 | Soak | 50 min | In mortar |
| 10 | Add 90 ml EL | | After transfer to 250 ml flask |
| 11 | Bath sonicate | 0.5 h | 5° C. |
| 12 | Centrifuge (10 krpm, 20° C.) | 0.5 h | In Teflon container |
| 13 | Decant supernatant | | Collect in 500 ml flask (200 ml); 25° C. |
| 14 | Grind sediment in 10 ml EL | 10 min | In mortar |
| 15 | Soak | 50 min | In mortar |
| 16 | Add 90 ml EL | | After transfer to 250 ml flask |
| 17 | Bath sonicate | 0.5 h | 5° C. |
| 18 | Centrifuge (10 krpm) | 0.5 h | In Teflon container |
| 19 | Decant supernatant | | Collect in 500 ml flask (300 ml); 25° C. |
| 20 | Allow to stand | 12 h | At 25° C. in closed flask |
| 21 | Sonicate | 1 h | 5° C. |
| 22 | Metrics | NA | Check for sheet resistance and SEM |
| 23 | Storage conditions | NA | In 250 ml polypropylene (PP) bottle; 5° C. |

EXAMPLE 3

This example describes an alternative method of preparing a nanotube composition.

Twenty-one mg carbon nanotubes were mixed in 10 mL EL and subjected to sonication, centrifugation, decanting of the supernatant and remixing of carbon nanotubes in EL for repeated sonication until the tubes were sufficiently solubilized; i.e., the nanotubes were subjected essentially the same steps as in Example 2, without grinding with mortar and pestle. The steps of the process are shown in Table 2.

TABLE 2

Alternate Process Flow Chart for SWNT solubilization in Ethyl-Lactate

| Step | Process | Duration | Remarks |
|---|---|---|---|
| 1 | Place 100 mg in 800 ml EL | N/A | In 1 L polypropylene (PP) bottle. |
| 2 | Add Teflon impellers | N/A | In 1 L PP bottle |
| 3 | Place on autoshaker | 100 h | Powered through a timer |
| 4 | Collect in a 1 L RB | N/A | HF cleaned flask, in cleanroom |
| 5 | Bath sonicate | 1 h | 5° C. |
| 6 | Centrifuge (15 krpm, 15° C.) | 2 h | 6 × 250; Beckman PP bottles |
| 7 | Decant supernatant | ~15 min | Collect in 1000 ml flask |
| 8 | Check for optical density at 550 nanometer. | N/A | If above 1.25 this needs to be adjusted to 1.25 by adding neat EL |
| 9 | Bath sonicate | 2 h | 5° C. |
| 10 | Centrifuge (25000 rpm, 15° C.) | 2 h | 8 × 50 cc, Beckman PP in 3 batches |
| 12 | Decant supernatant | N/A | Collect in 1000 ml flask (200 ml); 25° C. |
| 13 | Check for final metrics including sheet resistance and SEM | N/A | Bottled in a 1 L PP bottle rinsed with CMOS grade EL, |

EXAMPLE 4

This example describes the preparation of a nanotube article on a silicon substrate.

The solution prepared in Example 2 was spin coated onto a 100 mm oxide-coated silicon wafer. For comparison, a nanotube solution in EL using as-prepared, i.e., unpurified, nanotubes was spin coated onto a similar 100 mm oxide-coated silicon wafer. Six applications were used to generate a fabric or film onto the wafer surface. FIGS. 1 and 3 illustrate SEM images of unpurified SWNT material and purified SWNT material, respectively coated from a solution of SWNTs in ethyl lactate. The presence of particulate impurities is apparent in the unpurified sample (FIG. 1).

Figure 2:
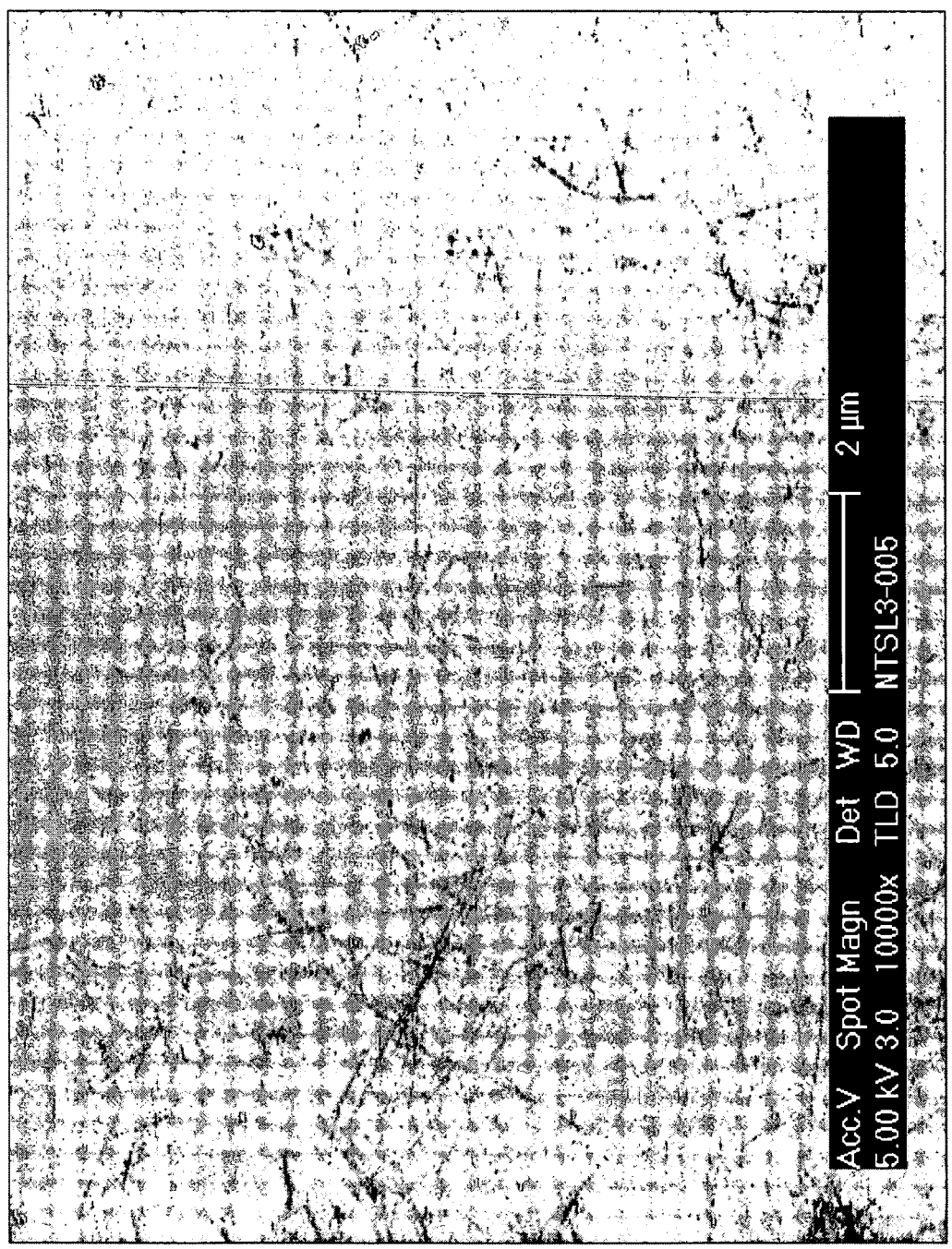
FIG. 2 illustrates a typical SEM image of a purified nanotube fabric.

The purified SWNT film showed significant reduction in amorphous carbon contamination after completion of the purification process (FIG. 2). The figures do not necessarily represent ideal electronics grade fabrics, but are shown simply to represent spun-on fabrics created from ethyl lactate.

Upon generation of a fabric the sheet resistance was measured to be 70 kOhm (center); 129+/−22 kOhm (edge). The following table (Table 3) summarizes several metric parameters including the optical density of a typical purified SWNT solution as well as the resistivity of a SWNT fabric on a 100 mm silicon wafer coated with a thick gate oxide.

TABLE 3

Metrics of Typical SWNT Fabric

| Metrics | Data | Remarks |
|---|---|---|
| Optical Density (550 nm) | 1.001 | |
| Sheet Resistance | 70 kohm (center), 129+/−22 kohm (edge) | 6 spins: 60 rpm, 500 rpm, 4000 rpm |

The solution can be used to form a component of NRAM memories, such as described in U.S. patent application Ser. No. 09/915,093, entitled "Electromechanical Memory Array Using Nanotube Ribbons and Method for Making Same", filed Jul. 25, 2001; U.S. Pat. No. 6,643,165, entitled "Electromechanical Memory Having Cell Selection Circuitry Constructed with Nanotube Technology," filed Jul. 25, 2001; U.S. Provisional Patent Apl. No. 60/459,223, entitled "NRAM Bit Selectable Two-Drive Nanotube Array," filed Mar. 29, 2003; and U.S. Provisional Patent Appl. No. 60/459,222, entitled "NRAM Byte/Block Released Bit Selectable One-Device Nanotube Array," filed Mar. 29, 2003. The solution holds potential as a stand alone commercial product to serve the research and development laboratories that work on single walled carbon nanotubes as well other applications.

EXAMPLE 5

This example describes the testing of trace metals on the surface of a nanotube article that is deposited on a silicon wafer.

A nanotube composition was prepared from nanotubes that had been purified of metallic and particulate impurities as described in Example 1 by dispersing the nanotubes in ethyl lactate medium as described in Example 2. The nanotube compositions were analyzed for surface metallic impurities by Vapor Phase Decomposition and Inductively-Coupled Plasma Mass Spectrometry (VPD, ICP/MS) by Chemtrace, Fremont, Calif.

Silicon wafers, with and without a deposited nanotube layer, were placed in a pre-cleaned high purity chamber saturated with hydrofluoric acid (HF) vapor. Untreated silicon wafers and ethyl lactate coated wafers were used as controls. The native or thermal oxide on the silicon wafer or deposited layer was dissolved in the presence of the HF vapor. Metal impurities incorporated into the layer were released and dissolved in the acid during the scanning process.

A drop of an ultrapure acid etchant is added to the surface and the analysis area is scanned in a reproducible manner. The scanning solution was then collected for ICP-MS analysis. The analysis area was the entire surface on one side of the wafer with 2 mm edge exclusion. Strict cleanroom practices were followed at all times. The VPD process was performed in a near Class 1 laminar flow mini-environment located in a Class 10 cleanroom. The ICP-MS instrument was operated in a Class 1000 cleanroom to minimize environmental source contamination.

A pre-cleaned silicon wafer was used as the control. In order to evaluate the source of metallic impurities in the solvent, a silicon wafer was treated (spin-coated) with electronics grade ethyl lactate alone (EL Control). Samples 1 through 3 represent three different nanotube compositions purified and prepared according to the methodology set out in Examples 1 and 2. The test results demonstrate that comparable levels of purity were achieved over a number of samples tested. Most of the metals tested were near the detection limit of the method. Notable exceptions to this were boron, calcium, cobalt, nickel potassium and sodium. However, the total and individual metals content were well below the lower limit of $15 \times 10^{10}$ atoms/cm$^3$ set by the ITRS. Care must be taken in post purification processing in order to preserve the purity levels thus attained. For example, it was observed that rinsing the as-deposited nanotubes with DI water reintroduced several metal impurities.

The results of trace metal analysis recording the elemental content SWNTs after being coated on silicon substrates are reported in Table 4. Measurements are recorded as the number of atoms for a given element ($\times 10^{10}$ atoms per cm$^2$).

TABLE 4

(Number Of Atoms For A Given Element $\times 10^{10}$ Atoms Per cm$^2$).

| | | Method Detection Limits | Control EL | Control | Sample 1 | Sample 2 | Sample 3 |
|---|---|---|---|---|---|---|---|
| Aluminum | (Al) | 0.3 | 0.91 | 0.57 | 0.78 | 0.33 | <0.3 |
| Antimony | (Sb) | 0.003 | <0.003 | <0.003 | <0.003 | <0.003 | <0.003 |
| Arsenic | (As) | 0.03 | 0.065 | 0.32 | <0.03 | <0.03 | <0.03 |
| Barium | (Ba) | 0.01 | <0.01 | <0.01 | <0.01 | <0.01 | <0.01 |
| Beryllium | (Be) | 0.1 | <0.1 | <0.1 | <0.1 | <0.1 | <0.1 |
| Bismuth | (Bi) | 0.002 | <0.002 | <0.002 | <0.002 | <0.002 | <0.002 |
| Boron | (B) | 1 | 140 | 220 | 5.7 | 5.9 | 5.3 |
| Cadmium | (Cd) | 0.005 | <0.005 | <0.005 | <0.005 | <0.005 | <0.005 |
| Calcium | (Ca) | 0.2 | 0.34 | 2.4 | 0.83 | 1.3 | 1.8 |
| Chromium | (Cr) | 0.1 | <0.1 | 0.11 | <0.1 | <0.1 | <0.1 |
| Cobalt | (Co) | 0.02 | <0.02 | <0.02 | 0.57 | 0.45 | 0.22 |
| Copper | (Cu) | 0.05 | <0.05 | 0.080 | <0.05 | 0.34 | <0.05 |
| Gallium | (Ga) | 0.005 | <0.005 | <0.005 | <0.005 | <0.005 | <0.005 |
| Germanium | (Ge) | 0.021 | <0.01 | <0.01 | <0.01 | <0.01 | <0.01 |
| Iron | (Fe) | 0.1 | <0.1 | 0.54 | 0.24 | 0.19 | 0.14 |
| Lead | (Pb) | 0.003 | <0.003 | 0.012 | <0.003 | 0.011 | <0.003 |
| Lithium | (Li) | 0.08 | <0.08 | <0.08 | <0.08 | <0.08 | <0.08 |
| Magnesium | (Mg) | 0.3 | <0.3 | <0.3 | <0.3 | <0.3 | <0.3 |

TABLE 4-continued (Number Of Atoms For A Given Element × $10^{10}$ Atoms Per cm$^2$).

|  |  | Method Detection Limits | Control EL | Control | Sample 1 | Sample 2 | Sample 3 |
|---|---|---|---|---|---|---|---|
| Manganese | (Mn) | 0.03 | <0.03 | 0.069 | <0.03 | <0.03 | <0.03 |
| Molybdenum | (Mo) | 0.01 | <0.01 | 0.014 | <0.01 | <0.01 | <0.01 |
| Nickel | (Ni) | 0.05 | <0.05 | <0.05 | 0.79 | 0.96 | 0.48 |
| Potassium | (K) | 0.2 | <0.2 | 3.5 | 0.30 | 1.2 | 0.73 |
| Sodium | (Na) | 0.2 | <0.2 | 7.1 | 1.2 | 2.1 | 1.5 |
| Strontium | (Sr) | 0.01 | <0.01 | <0.01 | <0.01 | <0.01 | <0.01 |
| Tin | (Sn) | 0.02 | <0.02 | <0.02 | <0.02 | <0.02 | <0.02 |
| Titanium | (Ti) | 0.1 | <0.1 | <0.1 | <0.1 | <0.1 | <0.1 |
| Tungsten | (W) | 0.005 | <0.005 | <0.005 | <0.005 | <0.005 | <0.005 |
| Vanadium | (V) | 0.03 | <0.03 | <0.03 | <0.03 | <0.03 | <0.03 |
| Zinc | (Zn) | 0.06 | <0.06 | 1.4 | 0.088 | 0.095 | 0.078 |
| Zirconium | (Zr) | 0.003 | 0.050 | <0.003 | <0.003 | <0.003 | <0.003 |

Other Embodiments

In certain embodiments concentrations of metallic or carbonaceous contamination that are above those required for CMOS fabrication may be acceptable. The present invention serves to exemplify creation of nanotube solutions with stringent requirements that meet or exceed those of a CMOS process flow but can be modified in applications that have relaxed requirements.

In certain embodiments the SWNT solutions may be modified or tailored to form thick nanotube coatings up to 100 microns thick or more and as thin as a monolayer of SWNTs. Such nanotube fabrics can be characterized by resistivity or capacitance measurements to meet the requirements of the specific electronics application.

As described herein, certain applicator liquids and application techniques are described, which can be used to form nanotube films or fabrics of controlled properties. For example, certain proposals have been made suggesting the benefits of substantially monolayers of nanotubes with substantially uniform porosity. Techniques have been provided in which one or more parameters may be controlled or monitored to create such films. Moreover, these liquids are intended for industrial environments, which require that the liquids be usable, i.e., that the nanotube suspension is stable, for periods of days, weeks and even months.

The invention claimed is:

1. A fullerene composition, comprising:
a liquid medium containing a distribution of fullerenes, wherein the fullerenes remain separate from one another without precipitation or flocculation for a time sufficient to apply the fullerene composition to a surface, and wherein the composition comprises less than $1 \times 10^{18}$ atoms/cm$^3$ of metallic impurities.

2. The fullerene composition of claim 1, wherein the composition comprises less than about $1 \times 10^{18}$ atoms/cm$^3$ of heavy metal impurities.

3. The fullerene composition of claim 1, wherein the composition comprises less than about $1 \times 10^{18}$ atoms/cm$^3$ of group I and group II element impurities.

4. The fullerene composition of claim 1, wherein the composition comprises less than about $1 \times 10^{18}$ atoms/cm$^3$ of transition metal impurities.

5. The fullerene composition of claim 1, wherein the composition comprises less than about $15 \times 10^{10}$ atoms/cm$^3$ of heavy metal impurities.

6. The fullerene composition of claim 1, wherein the composition comprises less than about $15 \times 10^{10}$ atoms/cm$^3$ of group I and group II element impurities.

7. The fullerene composition of claim 1, wherein the composition comprises less than about $15 \times 10^{10}$ atoms/cm$^3$ of transition metal impurities.

* * * * *